United States Patent [19]
Kyuma et al.

[11] Patent Number: 5,258,845
[45] Date of Patent: Nov. 2, 1993

[54] SOLID-STATE IMAGE SENSOR DRIVING DEVICE WITH SIGNAL SYNTHESIZING

[75] Inventors: Kenji Kyuma, Kanagawa; Nobuhiko Shinoda, Tokyo, both of Japan

[73] Assignee: Canon Kabushiki Kaisha, Tokyo, Japan

[21] Appl. No.: 890,296

[22] Filed: May 27, 1992

Related U.S. Application Data

[63] Continuation of Ser. No. 523,393, May 14, 1990, abandoned.

[30] Foreign Application Priority Data

May 19, 1989 [JP] Japan .................. 1-124562

[51] Int. Cl.$^5$ ................... H04N 3/14; H04N 5/335
[52] U.S. Cl. .................. 358/213.19; 358/213.25; 358/213.31
[58] Field of Search ............. 358/213.25, 213.19, 358/213.31, 228, 213.29

[56] References Cited

U.S. PATENT DOCUMENTS

| | | | |
|---|---|---|---|
| 4,573,076 | 2/1986 | Tisue et al. | 358/213.19 |
| 4,574,309 | 3/1986 | Arisawa et al. | 358/213.22 |
| 4,603,355 | 7/1986 | Yamada et al. | 358/213.22 |
| 4,631,593 | 12/1986 | Kinoshita et al. | 358/213.25 |
| 4,686,572 | 8/1987 | Takatsu | 358/213.19 |
| 4,779,137 | 10/1988 | Tojo et al. | 358/213.11 |
| 4,782,394 | 11/1988 | Hieda et al. | 358/213.19 |
| 4,800,435 | 1/1989 | Ikeda et al. | 358/213.19 |
| 4,805,024 | 2/1989 | Suzuki et al. | 358/213.19 |
| 4,839,734 | 6/1989 | Takemura | 358/213.25 |
| 4,843,474 | 6/1989 | Suzuki | 358/228 |
| 4,956,715 | 9/1990 | Okino et al. | 358/228 |
| 5,040,070 | 8/1991 | Higashitsutsumi et al. | 358/213.25 |
| 5,043,821 | 8/1991 | Suga et al. | 358/213.25 |
| 5,044,000 | 8/1991 | Iijima | 358/213.19 |

*Primary Examiner*—Michael T. Razavi
*Assistant Examiner*—Wendy R. Greening
*Attorney, Agent, or Firm*—Robin, Blecker, Daley & Driscoll

[57] ABSTRACT

A solid-state image sensor driving device comprises a sensing part which accumulates information by photoelectrically converting a light signal, a first storage part which reads the information from the sensing part and stores it, a second storage part which stores the information obtained from the first storage part, and a removing part which removes the information from the sensing part. The driving device is arranged to have the information intermittently removed by the removing part at least twice in one field period, to cause the first storage part to store the information obtained at the sensing part immediately before the removal by the removing part, and to cause the information stored at the first storage part to be shifted to the second storage part once in one field period.

22 Claims, 5 Drawing Sheets

SOLID-STATE IMAGE SENSOR DRIVING DEVICE WITH SIGNAL SYNTHESIZING

This is a continuation application under 37 CFR 1.62 of prior application Ser. No. 523,393, filed May 14, 1990, now abandoned.

BACKGROUND OF THE INVENTION

1. Field of the Invention

This invention relates to a solid-state image sensor driving device and more particularly to a device for driving an electronic shutter.

2. Description of the Related Art

Heretofore, video cameras or the like have been arranged to perform an exposure compensating function by various methods, including a method of directly controlling the quantity of light incident on an image sensor by means of diaphragm blades or the like; and another method of performing the function of the so-called electronic shutter whereby the electric charge accumulating time of the image sensor is controlled.

However, these conventional methods have presented the following problems: the method of using the diaphragm blades necessitates the diaphragm blades and related mechanical members. In the case of the method of performing the electronic shutter function, it tends to give an unnatural picture movement. Of these problems, the details of the problem presented by the method of performing the electronic shutter function are as follows:

FIG. 1 of the accompanying drawings conceptually shows an inter-line transfer type CCD image sensor. Referring to FIG. 1, the illustration includes a sensor part 1 which is arranged to perform photoelectric conversion; a vertical transfer register 2; a horizontal transfer register 4; and an output amplifier 5. FIG. 2 is a sectional view taken on a line A—A' of FIG. 1. FIG. 2 also shows potentials obtained at the image sensor.

Referring to FIG. 2, the illustration includes a channel stop 6 (hereinafter abbreviated to CS) which is arranged to separate picture elements; a read-out gate 7 (abbreviated to ROG) which is provided for moving the electric charge accumulated at the sensor part 1 to the vertical transfer register 2; a substrate 8; and an oxide film 9.

The following describes the electronic shutter function of the video camera with reference to FIGS. 2 and 3: FIG. 3 shows one-field amount of a standard TV signal. Referring to FIG. 3, a pulse $\phi$ROG is arranged to be applied to the read-out gate (ROG) 7. When this pulse is at a logical level H (high), the potential of the read-out gate 7 decreases to allow the electric charge of the sensor part 1 to be moved to the vertical transfer register 2. A removing pulse $\phi$SUB is arranged to be applied to the substrate 8. When that pulse is at the level H, the electric charge accumulated at the sensor part 1 is swept out to the outside through a $\phi$SUB terminal.

In FIG. 3, the conventional device described above is shown in a state of having the pulse $\phi$ROG in a vertical retrace line period and the pulse $\phi$SUB in a horizontal retrace line period. A next period begins after the electric charge of the sensor part 1 is read out at a point of time t0. However, since the pulse $\phi$SUB comes to be at the level H during a horizontal retrace line period up to a time point t1, the electric charge obtained during a period between the time points t0 and t1 is not remaining at the sensor part 1. During an ensuing period between time points t1 and t2, the pulse $\phi$SUB is at a level L (low). During this period, therefore, the electric charge is accumulated at the sensor part 1 until the time point t2. At the time point t2, the level H of the pulse $\phi$ROG causes the electric charge to be shifted to the vertical transfer register 2. In this instance, the exposure time of the camera is "t2−t1".

The conventional device thus adequately performs the function as an electronic shutter. However, in cases where the conventional electronic shutter function is to be used for continuously changing the exposure time for exposure correction, a difference in dynamic resolution between one exposure time and another appears on a picture. This tends to greatly impair the picture quality.

SUMMARY OF THE INVENTION

This invention is directed to the solution of the above-stated problem of the conventional device. It is, therefore, an object of the invention to provide a solid-state image sensor driving device which is of the kind serving as an electronic shutter and is capable of correcting an exposure ensuring a constant dynamic resolution to give a natural picture.

To attain this object, a solid-state image sensor driving device which is arranged according to this invention as an embodiment thereof comprises image sensing means for accumulating information obtained by photoelectrically converting a received light signal; first storage means for storing information read out from the image sensing means; second storage means for storing information read out from the first storage means; and removing means for removing information accumulated by the image sensing means. The embodiment is arranged to cause the removing means to perform a removal of information accumulated by the image sensing means, intermittently at least twice in one field period; to cause the first storage means to read and store information accumulated by the image sensing means immediately before the above removal; and to cause information stored in the first storage means to be shifted once in one field period to the second storage means.

With the embodiment arranged in this manner, information is intermittently accumulated during one field period by the sensing means; the information is read into the first storage means to store the sum of information; and the sum of information thus stored is output through the second storage means.

The above and other objects and features of the invention will become apparent from the following detailed description of an embodiment thereof taken in conjunction with the accompanying drawings.

DETAILED DESCRIPTION OF THE PREFERRED EMBODIMENT

Figure 1:
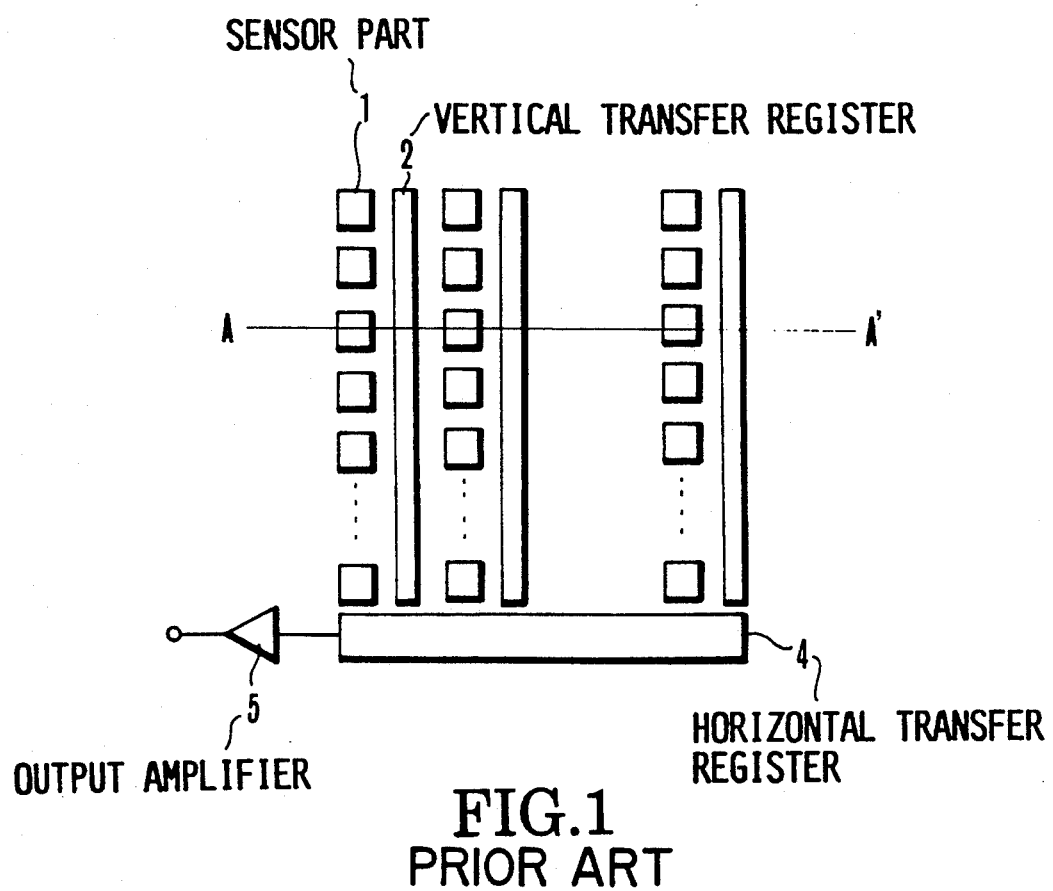
FIG. 1 conceptually shows the arrangement of an inter-line transfer type CCD image sensor.
Figure 4:
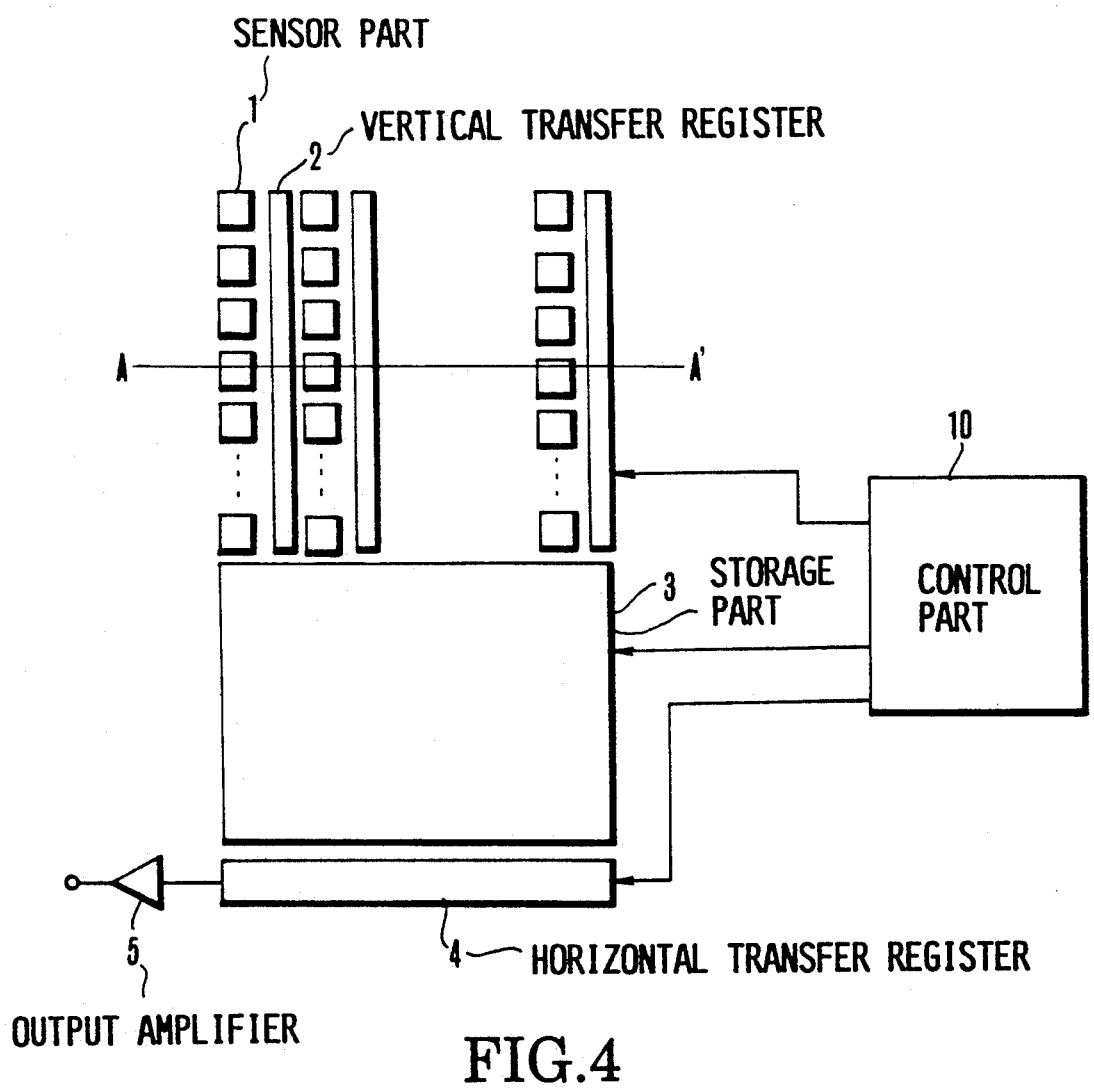
FIG. 4 conceptually shows the arrangement of a frame inter-line transfer type CCD image sensor which is included in an embodiment of this invention.

An embodiment of this invention is arranged as follows: FIG. 4 conceptually shows the arrangement of a CCD sensor used for the embodiment. This sensor is of the kind called a frame inter-line transfer type CCD. The CCD sensor differs from the CCD sensor of FIG. 1 in that the CCD sensor of the embodiment includes a storage part 3 serving as second storage means. The storage part 3 consists of storage cells. The number of the storage cells is the same as that of the cells of the sensor part 1 (image sensing means). The electric charge obtained from the sensor part 1 is shifted to a vertical transfer register 2 (first storage means). After that, the electric charge is transferred to the storage part 3 during the period of a vertical retrace line. After the transfer, the electric charge is shifted to a horizontal transfer register 4 to be read out through an output amplifier 5. These parts are driven and controlled by driving pulses output from a control part 10.

Figure 2:
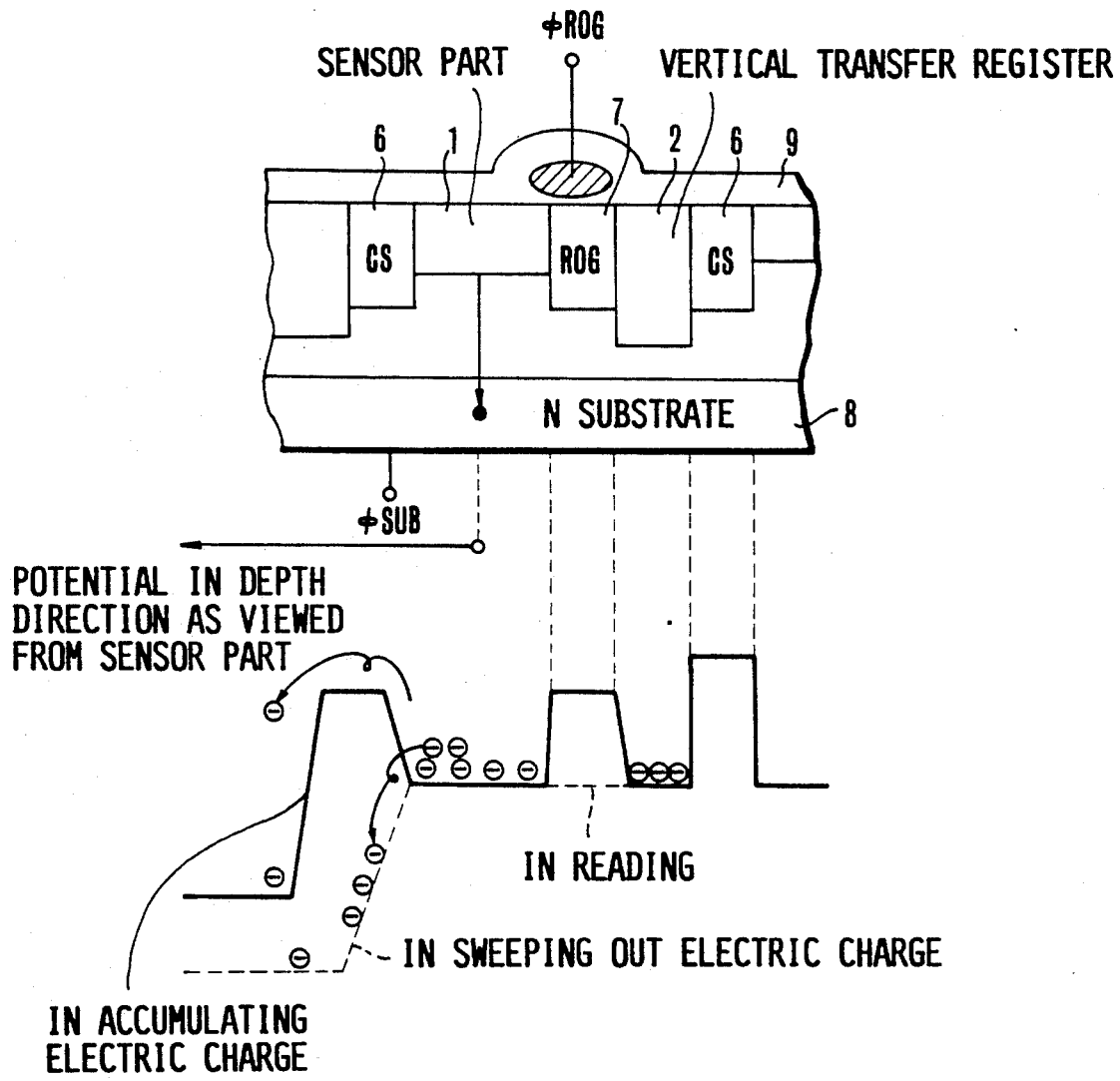
FIG. 2 is sectional view taken on a line A—A' of FIG. 1 and also illustrates the potential of the image sensor.
Figure 3:
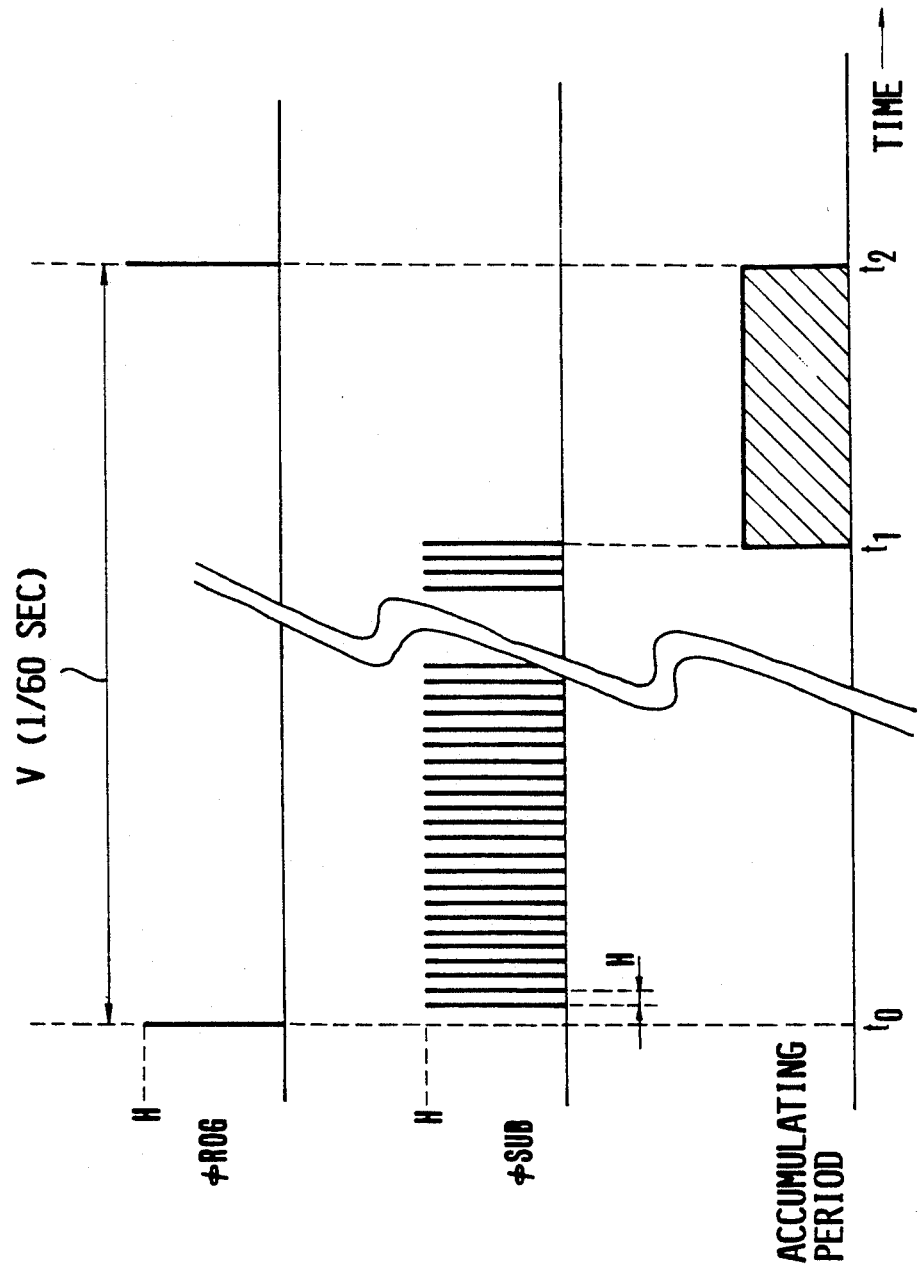
FIG. 3 shows the operation of the conventional electronic shutter.

The sectional view taken on a line A—A' of FIG. 4 and the potential of the embodiment are similar to those shown in FIG. 2. The electric charge sweeping-out mechanism and the mechanism of reading-out and shifting the electric charge to the vertical transfer register 2 are arranged in the same manner as described in the foregoing.

Figure 5:
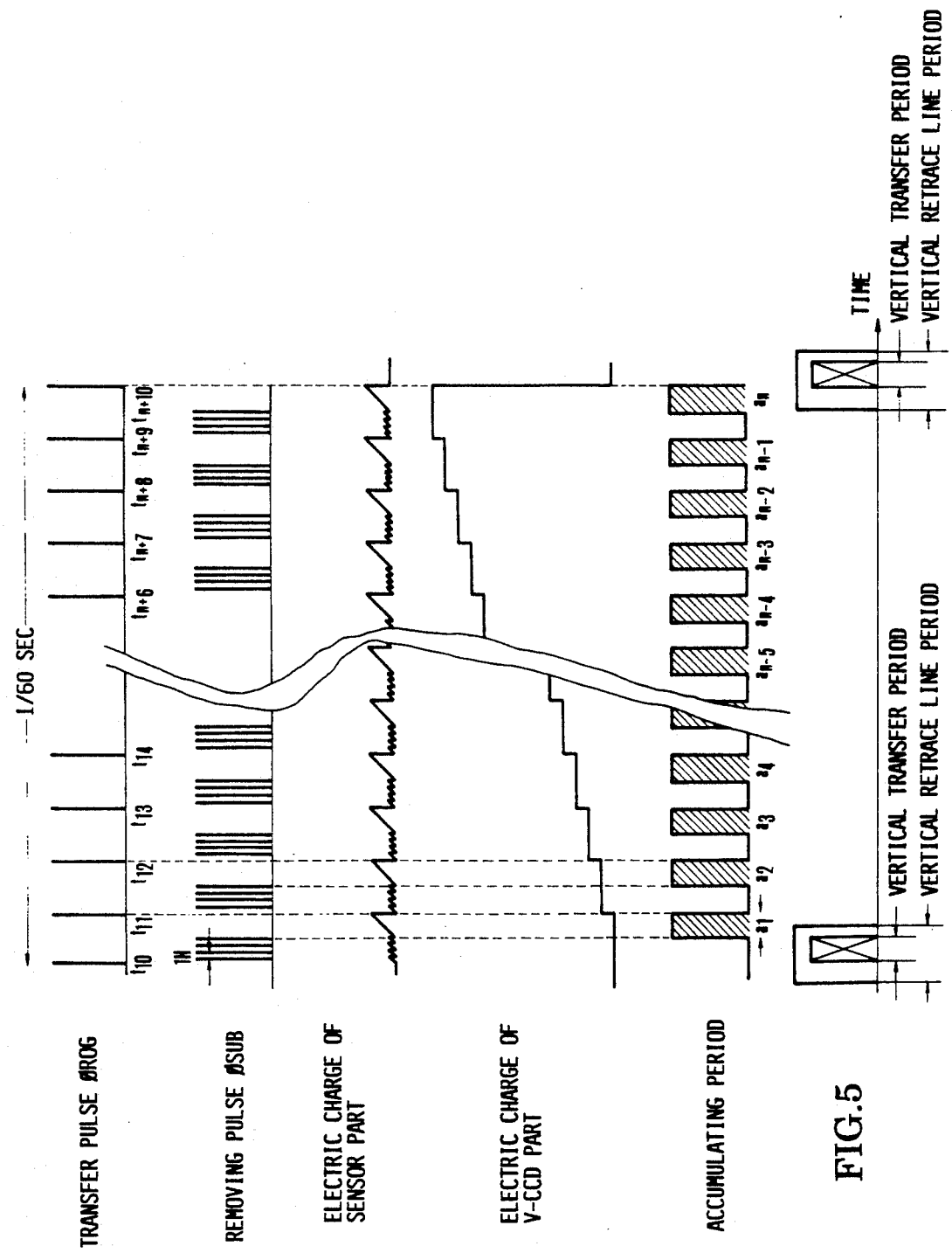
FIG. 5 shows the operation of the embodiment.

FIG. 5 shows the operation of this embodiment. In performing an exposure compensation by means of the CCD sensor of FIG. 4, the embodiment operates as described below:

The electric charge of the sensor part 1 which is obtained immediately before a point of time t10 is sent from the sensor part 1 to the vertical transfer register 2 at the point of time t10. One-field amount of electric charge thus obtained at the vertical transfer register 2 is sent at a high speed to the storage part 3 in a vertical retrace line period (during a vertical transfer period, as shown in FIG. 5). After this, as shown in FIG. 5, the removing pulse $\phi$SUB is driven in such a way as to enable the periods a1, a2, ..., an−1 and an immediately before the time points t11, t12, ..., tn+9 and tn+10 to be used as electric charge accumulating periods respectively. The electric charge is thus intermittently swept out (removed) and accumulated in an alternating manner. At each of the time points t11, t12, ..., tn+9 and tn+10, the electric charge is shifted from the sensor part 1 to the vertical transfer register 2 in accordance with the reading pulse $\phi$ROG. Therefore, at the time point tn+10 which is immediately after the end of the H level period of the reading pulse $\phi$ROG, the total amount of electric charge accumulated at the sensor part 1 during the accumulating periods a1, a2, ... and an is stored at the vertical transfer register 2. In other words, the sum total of electric charge accumulated at the vertical transfer register 2 is controlled by each period and the number of times for which the removing pulse $\phi$SUB is applied within one field period. This enables the CCD sensor to serve as a shutter.

As mentioned in the foregoing, the electric charge accumulating periods a1, a2, ... and an are finely and intermittently distributed within one field period. Therefore, the solid-state image sensor according to this invention is capable of performing an exposure compensation of the camera without producing any unnatural effect on the picture due to variations in dynamic resolution.

What is claimed is:
1. A solid-state image sensor driving device comprising:
   a) sensing means for accumulateing information obtained by photoelectrically converting a received light signal;
   b) first storage means for storing information read out from said sensing means;
   c) second storage means for storing information read out from said first storage means;
   d) removing means for removing information accumulated by said sensing means; and
   e) control means arranged to cause said removing means to perform a removal of information accumulated by said sensing means intermittently at least twice in one field period, to cause said first storage means to read out and store information accumulated by said sensing means immediately before each of said removals, and to cause information stored in said first storage means to be shifted to said second storage means once in one field period.

2. A device according to claim 1, wherein said first storage means includes a vertical transfer register.

3. A device according to claim 1 wherein said second storage means has a capacity for storing one field amount of signal electric charge.

4. A solid-state image sensor driving device comprising:
   a) sensing means for accumulating signal electric charge obtained by photoelectrically converting a light signal;
   b) storage means for storing signal electric charge read out from said sensing means;
   c) removing means for removing signal electric charge read out from said sensing means; and
   d) control means arranged to alternately cause said storage means and said removing means to read out signal electric charge from said sensing means a plurality of times in one field period, and to cause signal electric charge read out the plurality of times and stored by said storage means to be read out from said storage means once in said one field period.

5. A device according to claim 4, wherein said storage means has a capacity for storing one field amount of signal electric charge.

6. A device according to claim 4, wherein signal electric charge read out from said sensing means is arranged to be transferred to said storage means through a transfer register.

7. A device according to claim 4, wherein said control means is arranged to set a time interval between the timing of reading out from said sensing means to said storage means and the timing of reading out from said sensing means to said removing means in accordance with an exposure time.

8. A solid-state image sensor driving device arranged to store in storage means a signal electric charge obtained by photoelectrically converting image light of a photographing object by sensing means during an exposure time and to output the signal electric charge from said storage means at a first timing, comprising:
   control means arranged to cause the signal electric charge to be transferred from said sensing means to said storage means a plurality of times at a second timing which is within said first timing; and means for setting the number of transferrings to a said storage means depending on said exposure time.

9. A device according to claim 8, wherein said first timing is approximately equal to one field period.

10. A device according to claim 8, wherein said second timing is set in accordance with an exposure time.

11. An image sensing device, comprising:
   a) image sensing means for receiving a light coming from an object to be photographed and for photoelectrically converting the light into an electrical signal;
   b) image sensor driving means for affecting a plurality of times of electrical signal clearing operation intermittently in one field period and for effecting a plurality of times of electrical signal transfer operation in one field period; and
   c) storage means arranged to synthesize the plurality of electric signals transferred from said image sensing means.

12. An image sensing device according to claim 11, wherein said image sensing means and said storage means are formed on a common semiconductor substrate.

13. An image sensing device according to claim 11, wherein said storage means includes a plurality of storing areas corresponding to respective picture elements of said image sensing means, respectively, and combines the electric charges of one field period, for every picture element.

14. An image sensing device according to claim 11, further comprising:
   means for setting the electric charge accumulating time of said image sensing means in accordance with an exposure time.

15. An image sensing device according to claim 11, wherein said image sensor driving means effects said electrical signal clearing operation by sweeping out said electrical signal toward a depth direction of said image sensing means.

16. An image sensing device according to claim 11, wherein said image sensor driving means effects said electrical signal clearing operation by applying a predetermined pulse in a horizontal retrace line period.

17. An image sensing device, comprising:
   a) image sensing means for receiving a light coming from an object to be photographed and for photoelectrically converting the light into an electrical signal;
   b) image sensor driving means for affecting a plurality of times of electrical signal clearing operation intermittently in one field period by sweeping out said electrical signal toward a depth direction of said image sensing means and for effecting a plurality of times of electrical signal transfer operation in one field period; and
   c) synthesizing means arranged to synthesize the plurality of electrical signals transferred from said image sensing means.

18. An image sensing device according to claim 17, wherein said image sensing means and said synthesizing means are formed on a common semiconductor substrate.

19. An image sensing device according to claim 17, wherein said synthesizing means includes storage means.

20. An image sensing device according to claim 19, wherein said image sensing means and said storage means are formed on a common semiconductor substrate.

21. An image sensing device according to claim 19, wherein said storage means includes a plurality of storing areas corresponding to respective picture elements of said image sensing means, respectively, and combines the electric charges of one field period, for every picture element.

22. An image sensing device according to claim 17, wherein said image sensor driving means effects said electrical signal clearing operation by applying a predetermined pulse in horizontal retrace line period.

* * * * *